United States Patent
Soong et al.

(10) Patent No.: US 9,831,242 B2
(45) Date of Patent: Nov. 28, 2017

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chia-Wei Soong, Taoyuan (TW); Chih-Pin Tsao, Zhubei (TW); Hou-Yu Chen, Zhubei (TW); Chen Hua Tsai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/089,114

(22) Filed: Apr. 1, 2016

(65) Prior Publication Data

US 2017/0125412 A1    May 4, 2017

Related U.S. Application Data

(60) Provisional application No. 62/247,734, filed on Oct. 28, 2015.

(51) Int. Cl.
| | | |
|---|---|---|
| *H01L 27/088* | (2006.01) | |
| *H01L 21/8234* | (2006.01) | |
| *H01L 29/36* | (2006.01) | |
| *H01L 21/3115* | (2006.01) | |

(52) U.S. Cl.
CPC .... *H01L 27/0886* (2013.01); *H01L 21/31155* (2013.01); *H01L 21/823431* (2013.01); *H01L 21/823481* (2013.01)

(58) Field of Classification Search
CPC ....... H01L 21/31155; H01L 21/823431; H01L 21/823481; H01L 27/0886
See application file for complete search history.

(56) References Cited

U.S. PATENT DOCUMENTS

| | | |
|---|---|---|
| 8,487,378 B2 | 7/2013 | Goto et al. |
| 8,729,634 B2 | 5/2014 | Shen et al. |
| 8,826,213 B1 | 9/2014 | Ho et al. |
| 8,887,106 B2 | 11/2014 | Ho et al. |
| 2012/0074386 A1* | 3/2012 | Rachmady ............ B82Y 10/00 257/24 |
| 2014/0054679 A1* | 2/2014 | Tang .................... H01L 29/785 257/329 |
| 2014/0264438 A1* | 9/2014 | Holland ............... H01L 29/205 257/190 |

(Continued)

*Primary Examiner* — Christine Enad
(74) *Attorney, Agent, or Firm* — McDermott Will & Emery LLP

(57) ABSTRACT

In a method for manufacturing a semiconductor device, a doped layer is formed in a substrate. A barrier layer that is in contact with the doped layer is formed. A semiconductor layer is formed over the substrate and the barrier layer. A fin structure is formed by patterning the semiconductor layer, the barrier layer, and the doped layer such that the fin structure includes a channel region including the semiconductor layer and a well region including the doped layer. An isolation insulating layer is formed such that a first portion of the fin structure protrudes from the isolation insulating layer and a second portion of the fin structure is embedded in the isolation insulating layer. A gate structure is formed over the fin structure and the isolation insulating layer.

16 Claims, 15 Drawing Sheets

(56) References Cited

U.S. PATENT DOCUMENTS

| | | |
|---|---|---|
| 2014/0282326 A1 | 9/2014 | Chen et al. |
| 2015/0228755 A1* | 8/2015 | Wei .................... H01L 29/6681 |
| | | 257/192 |
| 2015/0255545 A1* | 9/2015 | Holland ............ H01L 29/66795 |
| | | 257/288 |

* cited by examiner

US 9,831,242 B2

SEMICONDUCTOR DEVICE AND MANUFACTURING METHOD THEREOF

CROSS-REFERENCE TO RELATED APPLICATIONS

This application claims the benefit of priority to U.S. Provisional Application No. 62/247,734, entitled "SEMICONDUCTOR DEVICE AND MANUFACTURING METHOD THEREOF," filed Oct. 28, 2015, which is incorporated herein by reference in its entirety.

TECHNICAL FIELD

The disclosure relates to a semiconductor integrated circuit, more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable, and better-controlled semiconductor transistor devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
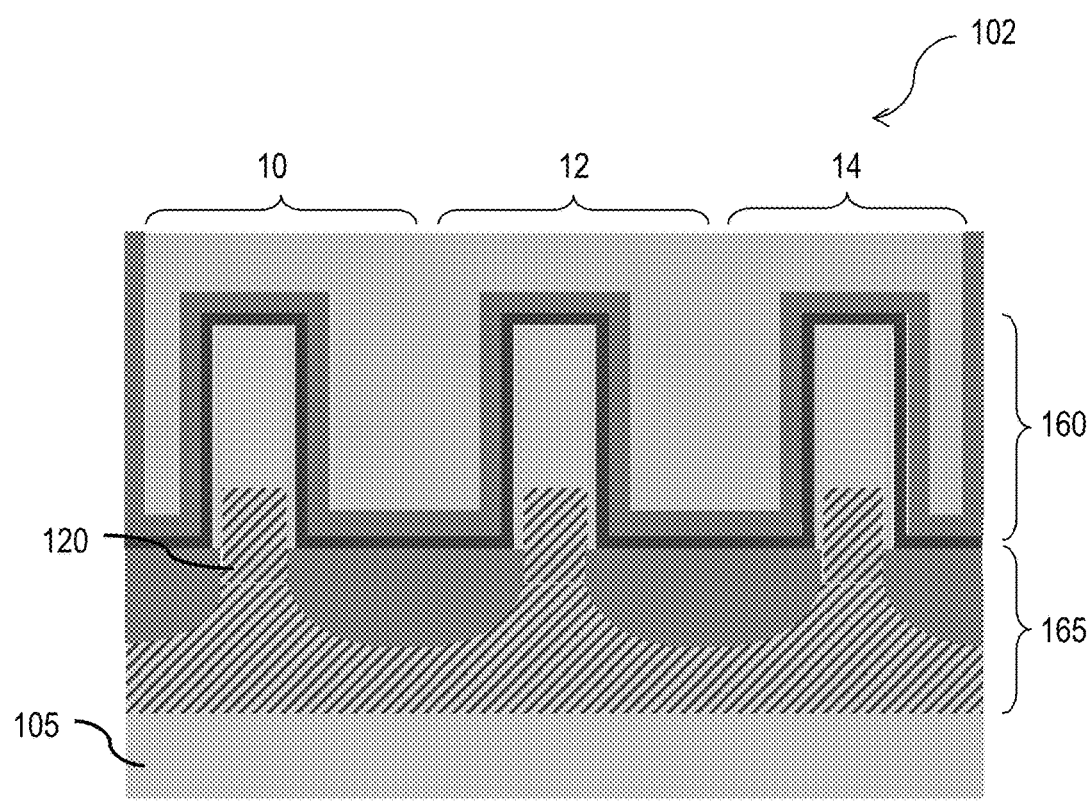
FIG. 1 illustrates an exemplary semiconductor FET device having a fin structure according to some embodiments of the present disclosure.

In one embodiment of the present disclosure, a Fin FET includes a structure to suppress impurities for a well region of the Fin FET from being diffused into a channel region of the Fin FET. For example, as shown in FIG. 1, a Fin FET device 102 includes a well region 165, a barrier layer 120, and a channel region 160 disposed over the well region 165. In one embodiment, the barrier layer 120 includes silicon carbide (SiC) or a Si compound including carbon. The barrier layer 120 may be epitaxially grown over a surface of a substrate 105. The barrier layer 120 can suppress impurities doped in the well region 165 from being diffused into the channel region 160 during, for example, thermal operations associated with manufacturing the Fin FET device 102. Although a barrier layer is a layer of material that is epitaxially grown in some embodiments, in other embodiments the barrier layer includes co-implantation dopants implanted into the substrate 105. The Fin FET device 102 includes fin structures 10, 12, and 14. However, the number of fin structures is not limited to three. The number of the fin structures may be one, two, four, five, or more.

FIGS. 2-13 illustrate exemplary sequential operations for manufacturing a semiconductor FET device having a fin structure according to some embodiments of the present disclosure. Not all of the depicted components may be required, however, and one or more implementations may include additional components not shown in the figures. Variations in the arrangement and type of the components may be made without departing from the scope of the claims as set forth herein. Additional components, different components, and/or fewer components may be provided. Further, the order of the operations may be changed.

Figure 2:
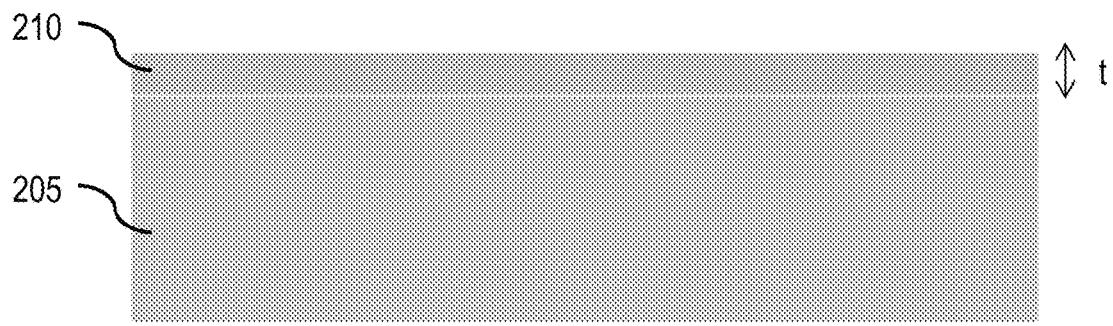
FIGS. 2-13 illustrate exemplary sequential operations for manufacturing a semiconductor FET device having a fin structure according to some embodiments of the present disclosure.

In FIG. 2, an epitaxial layer 210 is epitaxially grown over a surface of a substrate 205. The epitaxial layer 210 will be subsequently used as a barrier layer and includes a material that has a barrier property against impurities in a well region.

The epitaxial layer 210 may be, for example, a silicon compound including carbon or silicon carbide (SiC). The epitaxial layer 210 may have a thickness t in a range of about 2 nm to about 30 nm. In some embodiments, the epitaxial layer 210 has a thickness t in the range of about 2 nm to about 10 nm.

The substrate 205 is, for example, a p-type silicon substrate with a dopant concentration in a range of about $1 \times 10^{15}$ cm$^{-3}$ and about $1 \times 10^{18}$ cm$^{-3}$. In other embodiments, the substrate 205 is an n-type silicon substrate with a dopant concentration in a range of about $1 \times 10^{15}$ cm$^{-3}$ and about $1 \times 10^{18}$ cm$^{-3}$. The substrate 205 has a (100) upper surface in some embodiments.

Alternatively, the substrate 205 may include another elementary semiconductor, such as germanium; a compound semiconductor including Group Iv-Iv compound semiconductors such as SiC and SiGe, Group III-v compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 205 is a silicon layer of an SOI (silicon-on-insulator) substrate. Amorphous substrates, such as amorphous Si or amorphous SiC, or an insulating material, such as silicon oxide may also be used as the substrate 205. The substrate 205 may include various regions that have been suitably doped with impurities (e.g., p-type or n-type conductivity).

Figure 3:
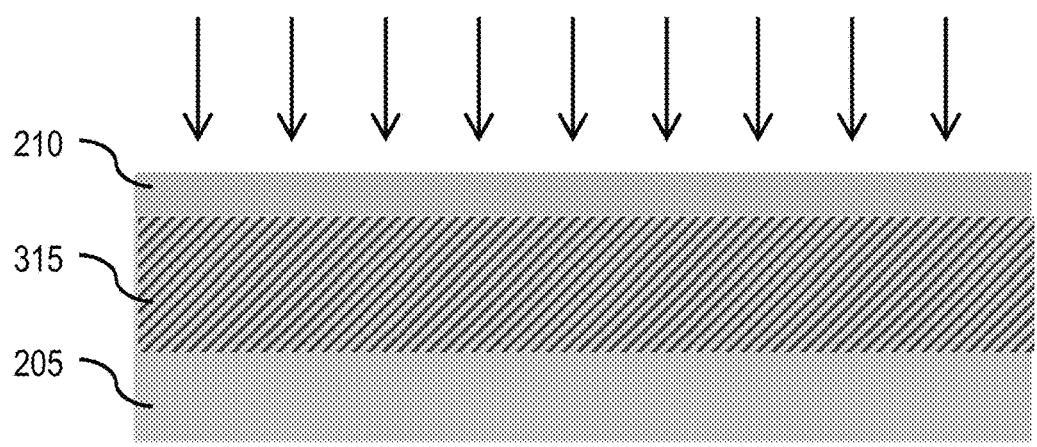

In FIG. 3, dopants, which may also be referred to as impurity ions, are implanted into the substrate 205 to form a doped layer 315 in the substrate 205. In some embodiments, an ion implantation operation is utilized to implant the dopants in the substrate 205. The dopants may be, for example, boron, boron difluoride (BF$_2$), fluorine, indium, or combination thereof to fabricate a p-well for an n-type Fin FET, and phosphorus, arsenic, fluorine, or combination thereof to fabricate an n-well for a p-type Fin FET. In some embodiments, an additional ion implantation operation to implant an anti-punch through (APT) implant is performed to prevent a punch-through effect. The APT implant is generally utilized for bulk-fin short channel effect (SCE) control.

Figure 4:
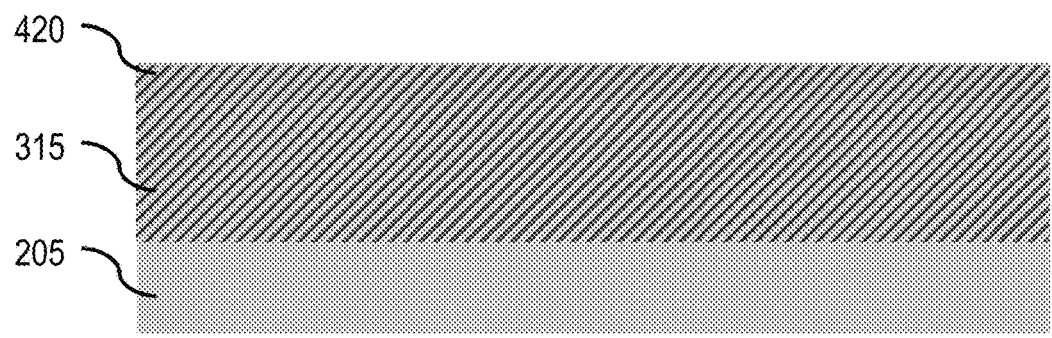

Subsequent to the implantation operation shown in FIG. 3, an annealing operation is performed to activate the dopants in the doped layer 315. The annealing operation may be performed at a temperature of about 800° C. to about 1200° C. for up to about a minute. In some embodiments, the annealing operation is performed at a temperature of about 600° C. to about 1100° C. for about 0.1 second to about 30 seconds. The annealing operation may cause the dopants to diffuse into the epitaxial layer 210, thus forming a doped epitaxial layer 420 as shown in FIG. 4. The doped epitaxial layer 420 may include the well implants (e.g., boron for p-well, phosphorus for n-well) and the APT implant.

Figure 5:
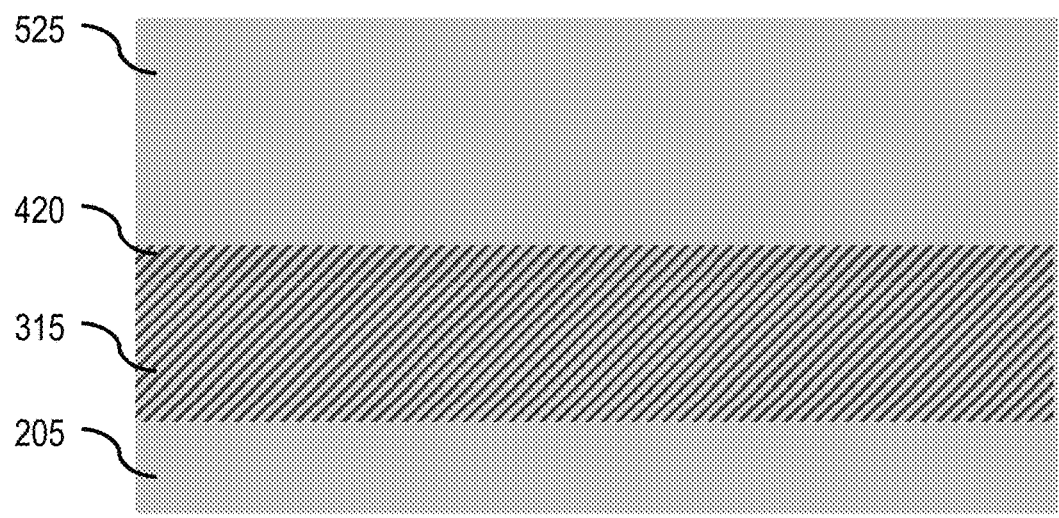

In FIG. 5, an epitaxial layer 525 is epitaxially grown over a surface of the doped epitaxial layer 420. The epitaxial layer 525 may be, for example, silicon, SiC, Group III-V compound material, or other suitable material. In some embodiments, the substrate 205 and the epitaxial layer 525 is one of silicon, Ge, or Group III-V epitaxial layer. The epitaxial layer 525 is later used to form one or more fin structures. The height of the epitaxial layer 525 is in a range of about 100 nm to about 300 nm in some embodiments, and is in a range of about 50 nm to 100 nm in other embodiments.

Figure 6:
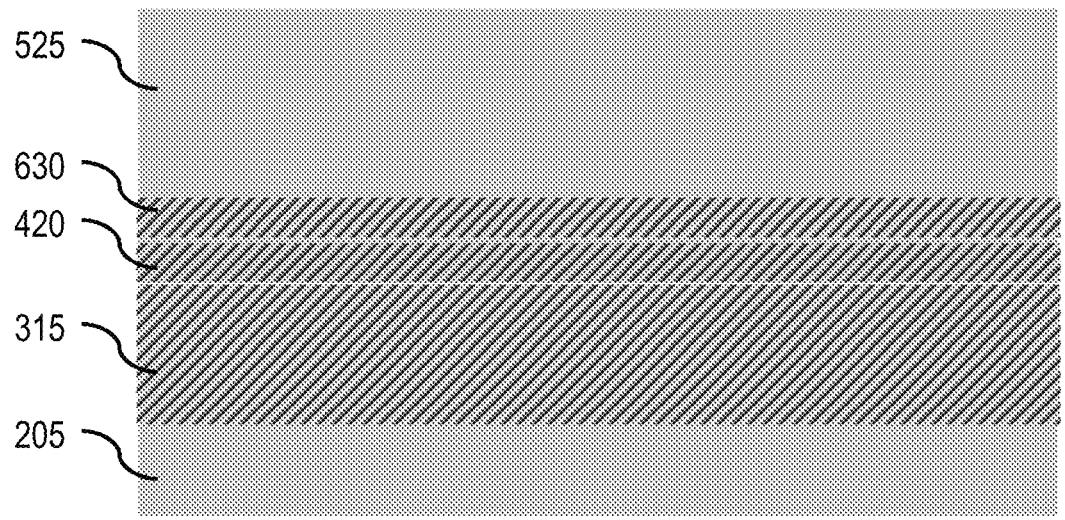

As shown in FIG. 6, temperatures associated with the epitaxial growth of the epitaxial layer 525 may cause some dopants in the doped layer 315 and the doped epitaxial layer 420 to diffuse into the epitaxial layer 525 to form a doped layer 630 in the epitaxial layer 525. However, since the doped epitaxial layer 420, which is utilized as a barrier layer, is disposed between the doped layer 315 and the epitaxial layer 525, the amount of impurities that are diffused into the epitaxial layer 525 can be minimized. In this regard, the doped epitaxial layer 420 may facilitate dopant diffusion control through confinement of a dopant profile associated with the doped layer 315 so as to reduce back-diffusion of the dopants from the doped layer 315 to the epitaxial layer 525.

Figure 7:
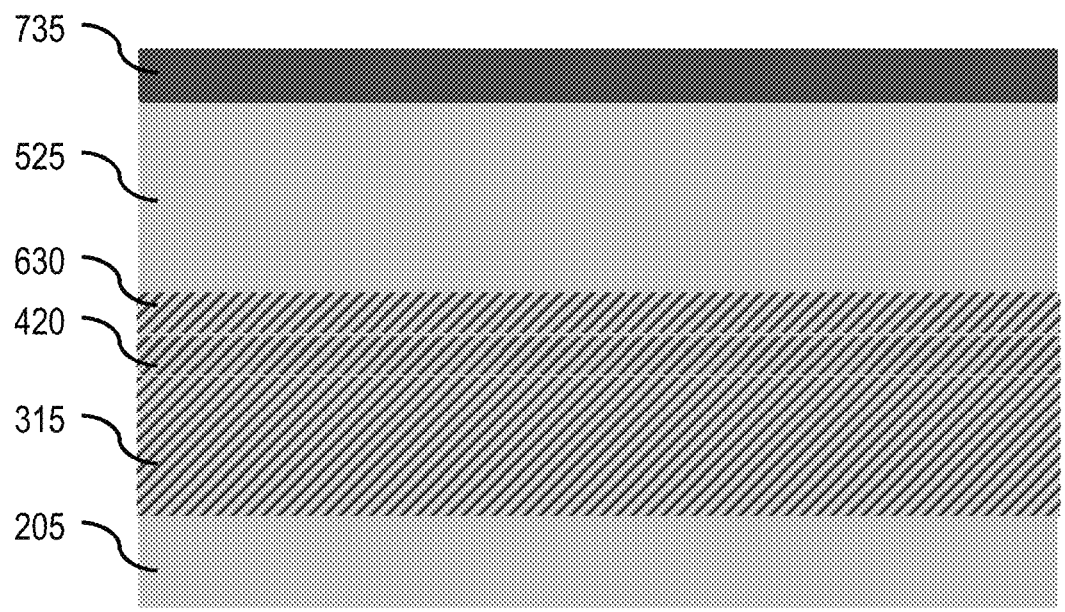

In FIG. 7, a mask layer 735 is formed over the epitaxial layer 525. The mask layer 735 may include, for example, a pad oxide layer and a mask layer. In some embodiments, the pad oxide layer is a silicon oxide layer and the mask layer is a silicon nitride (SiN) mask layer. The pad oxide layer may be formed, for example, using a thermal oxidation operation and may act as an adhesion layer between the epitaxial layer 525 and the silicon nitride mask layer. The silicon nitride mask layer may be formed using a chemical vapor deposition (CVD), such as low-pressure CVD (LP-CVD) or plasma enhanced CVD (PECVD). The thickness of the pad oxide layer is in a range of about 2 nm to about 15 nm and the thickness of the silicon nitride mask layer is in a range of about 10 nm to about 50 nm in some embodiments.

Figure 8:
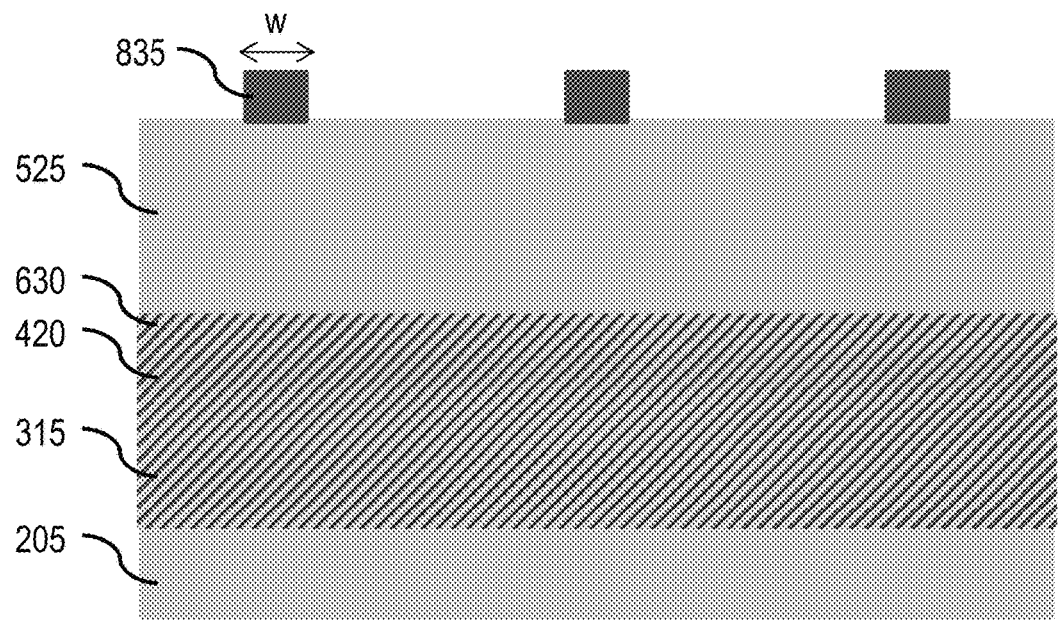

As shown in FIG. 8, by applying patterning operations, the mask layer 735 is patterned into mask patterns 835. The width w of each of the mask patterns 835 is in a range of about 5 nm to about 40 nm in some embodiments, or is in a range of about 10 nm to about 30 nm in other embodiments.

Figure 9:
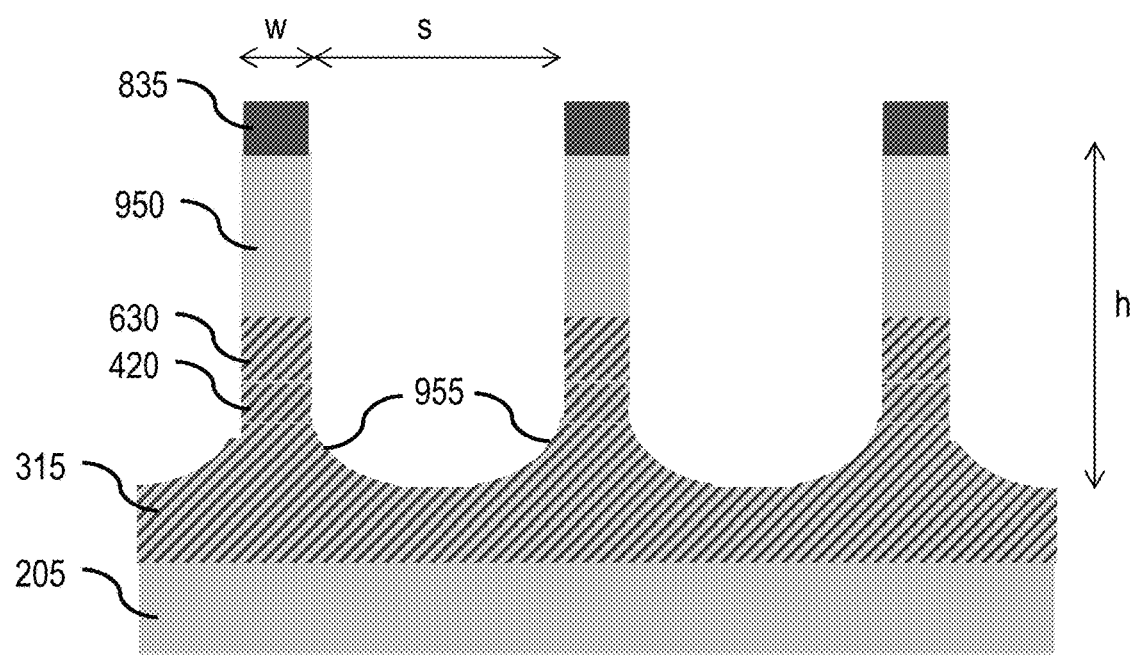

As shown in FIG. 9, by using the mask patterns 835 as etching masks, the epitaxial layer 525, the doped layer 630 of the epitaxial layer 525, the doped epitaxial layer 420, and the doped layer 315 of the substrate 205 are patterned into fin structures 950 by performing a trench etching operation. In some embodiments, a bottom portion of the fin structures 950 has a curved shape 955.

The trench etching operation may be performed by various operations including a dry etching operation, a wet etching operation, or a combination of a dry etching operation and a wet etching operation. The dry etching operation may use fluorine-containing gas (e.g., CF$_4$, SF$_6$, CH$_2$F$_2$, CHF$_3$, and/or C$_4$F$_8$), chlorine-containing gas (e.g., Cl$_2$, CHCl$_3$, CCl$_4$, and/or BCl$_3$), bromine-containing gas (e.g., HBr and/or CHBr$_3$), oxygen-containing gas, iodine-containing gas, other suitable gases and/or plasmas, or combinations thereof.

In FIG. 9, three fin structures 950 are disposed adjacent to each other. However, the number of the fin structures is not limited to three. The number of the fin structures may be one, two, four, five, or more. In addition, one or more dummy fin structures may be disposed adjacent to both sides of the fin structures 950 to improve pattern fidelity in patterning operations. The width w of the fin structures 950 is in a range of about 5 nm to about 40 nm in some embodiments, and is in a range of about 7 nm to about 15 nm in certain embodiments. The height h of the fin structures 950 is in a range of about 100 nm to about 300 nm in some embodiments, and is in a range of about 50 nm to about 100 nm in other embodiments. The space s between the fin structures 950 is in a range of about 5 nm to about 80 nm in some embodiments, and is in a range of about 7 nm to about 15 nm in other embodiments. One skilled in the art will realize, however, that the dimensions and values recited throughout the descriptions are merely examples, and may be changed to suit different scales of integrated circuits.

Figure 10:
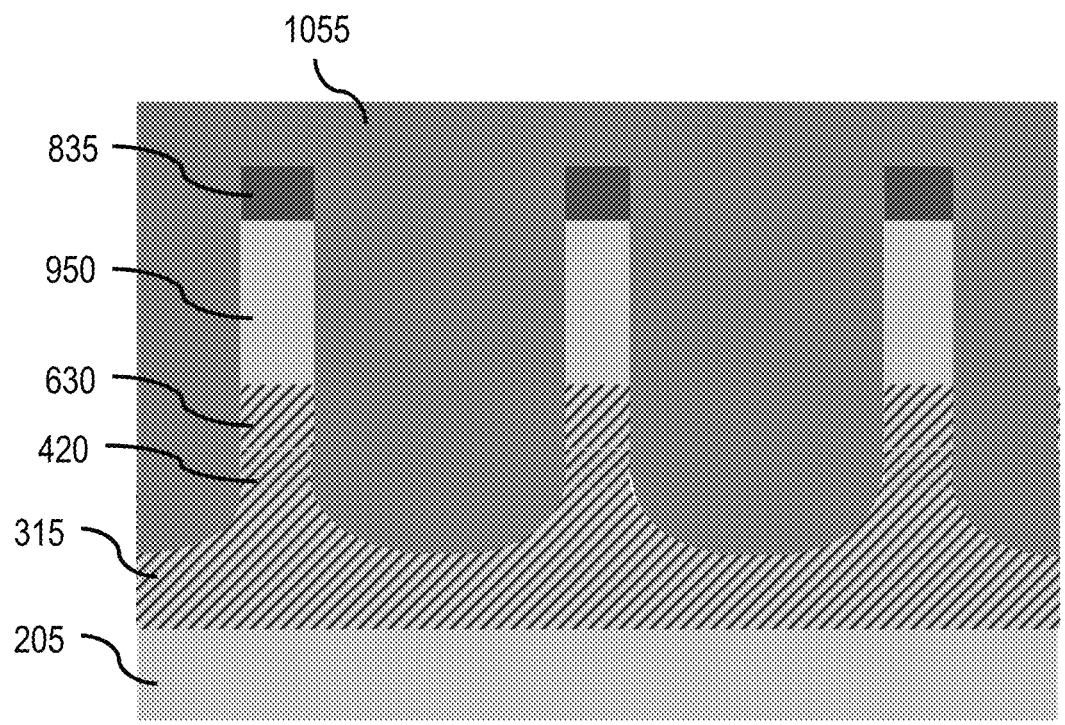

In FIG. 10, an isolation insulating layer 1055, grown as part of a shallow trench isolation (STI) operation, is formed on a surface of the doped layer 315 of the substrate 205 and around the fin structures 950 and the mask patterns 835 so as to fully embed the fin structures 950 and the mask patterns 835. The isolation insulating layer 1055 may include one or more layers of insulating material. Each layer of insulating material may include, for example, silicon oxide, silicon dioxide, silicon nitride, silicon oxynitride (SiON), SiOCN, fluorine-doped silicate glass (FSG), or a low-k dielectric material. The isolation insulating layer 1055 may be formed using a CVD operation, such as a LPCVD operation, a plasma-CVD operation, a flowable CVD operation, a molecular layer deposition (MLD) operation, among others.

In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 1055 is formed by one or more layers of SOG, SiO, SiON, SiOCN or fluorine-doped silicate glass (FSG) in some embodiments.

Figure 11:
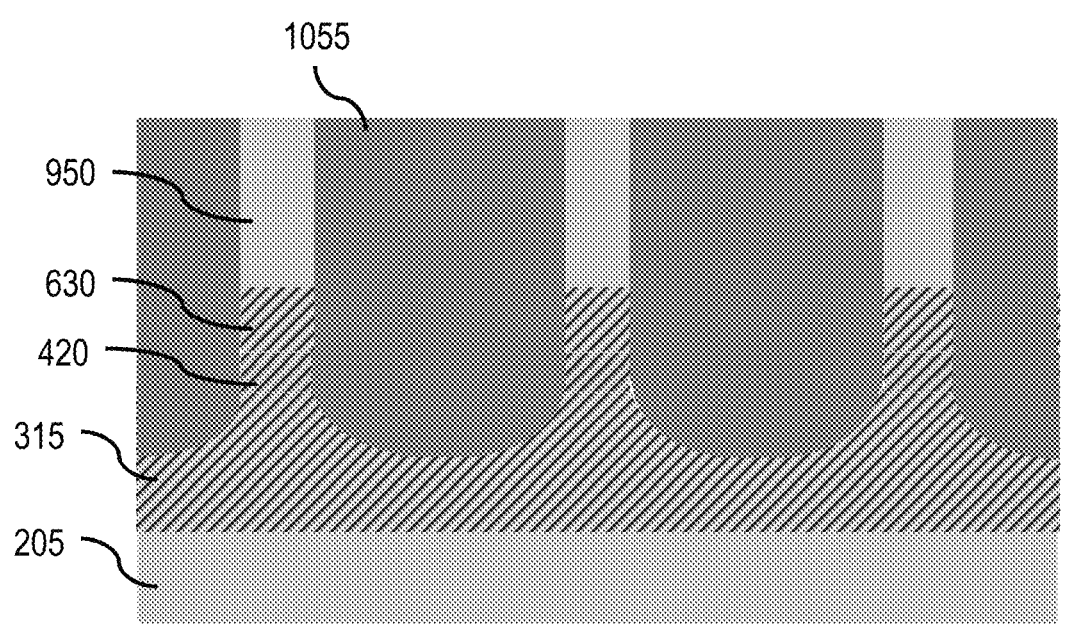
Figure 12:
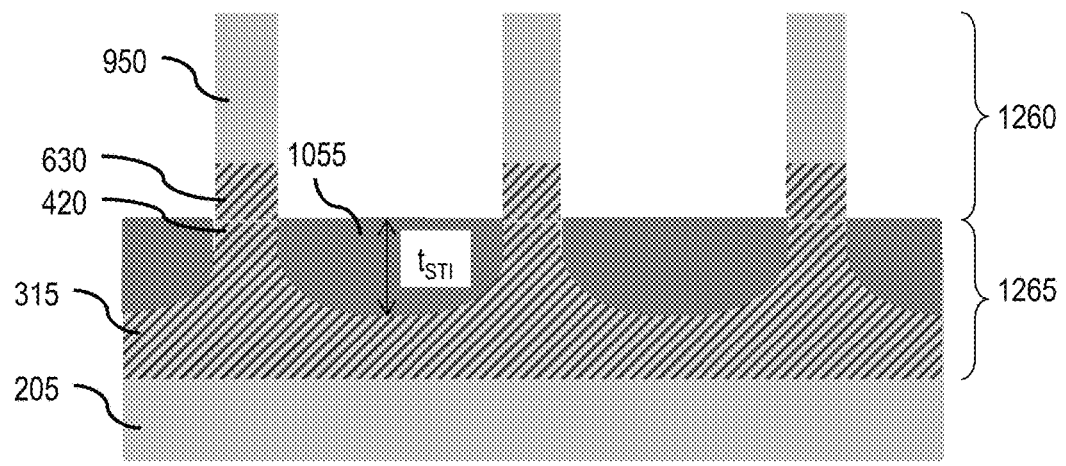

In FIG. 11, the mask patterns 835 and a portion of the isolation insulating layer 1055 are removed by, for example, a chemical mechanical polishing (CMP) operation or other planarization operations such as an etch-back operation. In FIG. 12, the isolation insulating layer 1055 is etched. The etching operation may be performed by various operations including a dry etching operation, a wet etching operation, or a combination of a dry etching operation and a wet etching operation. The dry etching operation may use fluorine-containing gas (e.g., $CF_4$, $SF_6$, $CH_2F_2$, $CHF_3$, and/or $C_4F_8$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. A resulting thickness $t_{STI}$ of the isolation insulating layer 1055 may be in a range of about 100 nm to about 600 nm. In some embodiments, the resulting thickness $t_{STI}$ of the isolation insulating layer 1055 is in a range of about 30 nm to about 200 nm. In this embodiment, the isolation insulating layer 1055 is etched such that an uppermost surface of the isolation insulating layer 1055 is substantially equal to an uppermost surface of the doped epitaxial layer 420. A portion of the fin structures 950 that protrudes from the isolation insulating layer 1055 becomes a channel region 1260 of a Fin FET and a portion of the fin structures 950 embedded in the isolation insulating layer 1055 becomes a well region 1265 of the Fin FET. The well region 1265 of the Fin FET includes the doped layer 315 and the doped epitaxial layer 420.

Figure 13:
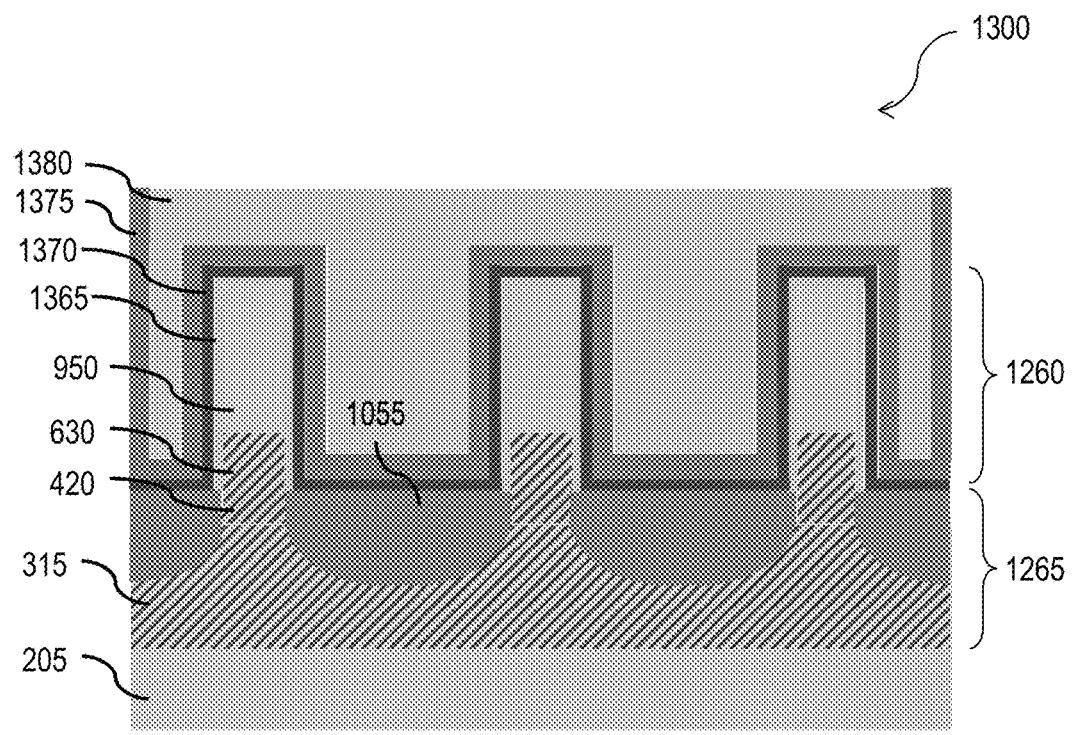

In FIG. 13, a gate structure is formed on the fin structures 950 and the isolation insulating layer 1055 to form a Fin FET device 1300. The gate structure includes an interfacial layer 1365, a gate dielectric layer 1370, a work function adjustment layer 1375, and a gate electrode 1380, each of which is deposited on the fin structures 950 and the isolation insulating layer 1055.

The interfacial layer 1365 may include a dielectric material such as a silicon oxide layer ($SiO_2$). The interfacial layer 1365 may be formed by chemical oxidation, thermal oxidation, atomic layer deposition (ALD), CVD, and/or other suitable operations. Although a single layer of material is shown for the interfacial layer 1365, high-k dielectric layer 1370, work function adjustment layer 1375, gate electrode 1380, each of the interfacial layer 1365, high-k dielectric layer 1370, work function adjustment layer 1375, and gate electrode 1380 may include multiple layers of material.

In some embodiments, the gate dielectric layer 1370 includes one or more layers of dielectric materials, such as silicon oxide, silicon nitride, high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$-$Al_2O_3$) alloy, other suitable high-k dielectric materials, and/or combinations thereof. In some embodiments, hafnium oxide ($HfO_2$) is used. The high-k dielectric layer 1370 may be formed by ALD, CVD, physical vapor deposition (PVD), high density plasma CVD (HDPCVD), or other suitable operations, and/or combinations thereof. The thickness of the high-k dielectric layer 1370 is in a range of about 1 nm to about 10 nm in some embodiments, and is in a range of about 2 nm to about 7 nm in other embodiments.

In some embodiments, the work function adjustment layer 1375 is interposed between the high-k dielectric layer 1370 and the gate electrode 1380. The work function adjustment layer 1375 is made of a conductive material such as a single layer of TiN, TaN, TaAlC, TiC, TaC, Co, Al, TiAl, HfTi, TiSi, TaSi or TiAlC, or a multilayer of two or more of these materials. For an n-type Fin FET, one or more of TaN, TaAlC, TiN, TiC, Co, TiAl, HfTi, TiSi, and TaSi is used as the work function adjustment layer, and for a p-channel Fin FET, one or more of TiAlC, Al, TiAl, TaN, TaAlC, TiN, TiC, and Co is used as the work function adjustment layer. The work function adjustment layer 1375 may be formed by ALD, PVD, CVD, e-beam evaporation, or other suitable operation.

In some embodiments, the gate electrode 1380 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In some embodiments, for an n-type Fin FET, the well region 1265 of the Fin FET device 1300 includes p-type dopants, such as boron, indium, fluorine, and nitrogen. In some embodiments, for a p-type Fin FET, the well region 1265 of the Fin FET device 1300 includes n-type dopants, such as phosphorus, arsenic, fluorine, carbon, and nitrogen.

The epitaxial layer 210 may be used to facilitate dopant diffusion control. In facilitating dopant diffusion control, the epitaxial layer 210 may be used as a barrier material to confine a dopant profile associated with the doped layer 315 so as to reduce back-diffusion of the dopants from the doped layer 315 to the epitaxial layer 525. The confinement of the dopant profile facilitates achievement of an abrupt dopant profile between the channel region 1260 and the well region 1265. The epitaxial layer 210 may allow for better profile abruptness between the channel region 1260 and the well region 1265 of the Fin FET device 1300 by functioning as an interstitial atom getter that retards dopant diffusion. In this regard, carbon impurities in the epitaxial layer 210 may be referred to as gettering impurities. By functioning as an interstitial atom getter, the epitaxial layer 210 may also reduce channel defect formation during the fin formation operation.

The diffusion may occur during a thermal operation (e.g., annealing operation, epitaxial growth operation), and may cause the dopants from the well region 1265 to exist in the channel region 1260 of the Fin FET device 1300, which may induce device performance degradation. For example, the back-diffusion may cause random dopant fluctuation within the channel region of the Fin FET device 1300 and cause threshold voltage ($V_t$) mismatch relative to a case without the back-diffusion. The reduction in the diffusion may improve short channel control and carrier mobility and may reduce random dopant fluctuation in the Fin FET device 1300. The random dopant fluctuation may be a result of unintended dopants due to back-diffusion of the APT and/or well dopants. Furthermore, a reduction of channel defect formation, such as in the epitaxial layer 525, may allow an improved effective width ($W_{eff}$) and an improved yield.

Although the foregoing describes dopants being implanted into a substrate subsequent to an epitaxial layer being grown, dopants are implanted into a substrate to form a well layer prior to an epitaxial layer being grown in some embodiments. In the following embodiments, the structures, materials, operations, processes and/or configuration same as or similar to the foregoing embodiments may be employed, and the detailed description thereof may be omitted.

Figure 14:
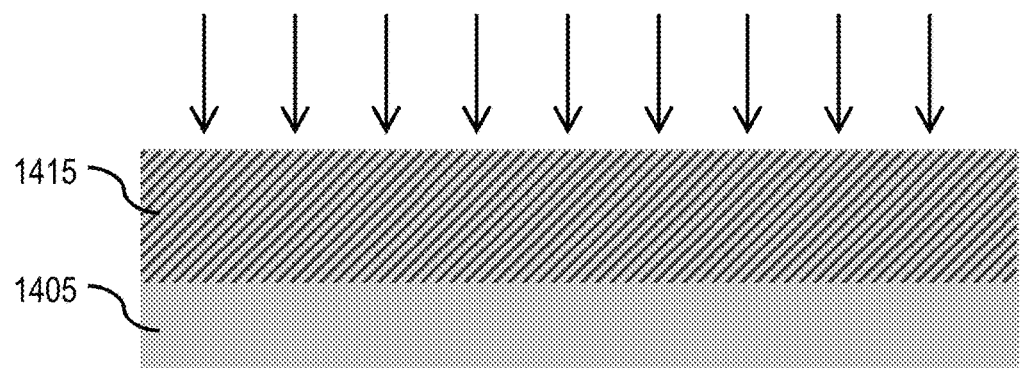
FIGS. 14 and 15 illustrate exemplary operations for manufacturing a semiconductor FET device having a fin structure according to some embodiments of the present disclosure.
Figure 15:
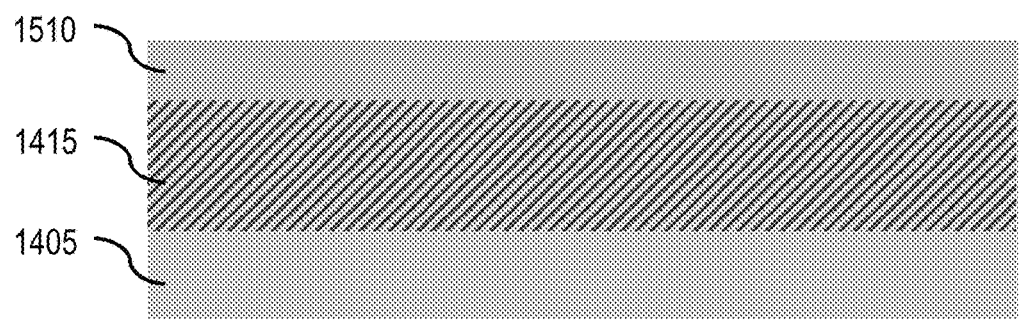

As shown in FIG. 14, dopants are implanted into a substrate 1405 to form a doped layer 1415 in the substrate 1405, by using, for example, ion implantation as described with respect to FIG. 3. In FIG. 15, an epitaxial layer 1510 is epitaxially grown over the doped layer 1415 of the substrate 1405, similar to the manufacturing operations with respect to FIG. 2. The epitaxial layer 1510 may be, for example, silicon or silicon carbide (SiC). In some embodiments, an annealing operation is performed after the implantation of the dopants into the substrate 1405 and before epitaxially growing the epitaxial layer 1510. In other embodiments, an annealing operation is performed after epitaxially growing the epitaxial layer 1510.

Comparing FIG. 3 with FIG. 14, the implant energy utilized in the ion implantation of FIG. 14 may be lower than that utilized in FIG. 3, since in FIG. 14 the epitaxial layer 1510 is grown after the dopants are implanted into the substrate 1405. In some embodiments, subsequent operations performed in order to form the Fin FET device 1300 follow those illustrated in and described with reference to FIGS. 4 through 13.

In some embodiments, instead of forming a SiC layer over the well layer, carbon ions are implanted at and near the surface of a doped layer (e.g., 315 in FIG. 3) to form a barrier layer. The carbon ion implantation may be directly made onto the surface of the doped layer or through an oxide layer formed on the surface of the doped layer. If an oxide layer is formed, after the carbon ion implantation, the oxide layer is removed by, for example, dry etching and/or wet etching.

Although the foregoing describes, with reference to FIG. 12, an etching operation being performed on an isolation insulating layer (e.g., 1055 in FIG. 12) such that the resulting isolation insulating layer has an uppermost surface that is substantially equal to an uppermost surface of a doped epitaxial layer (e.g., 420 in FIG. 12), in other embodiments, the etching operation is performed such that the isolation insulating layer is positioned at a different location.

Figure 16:
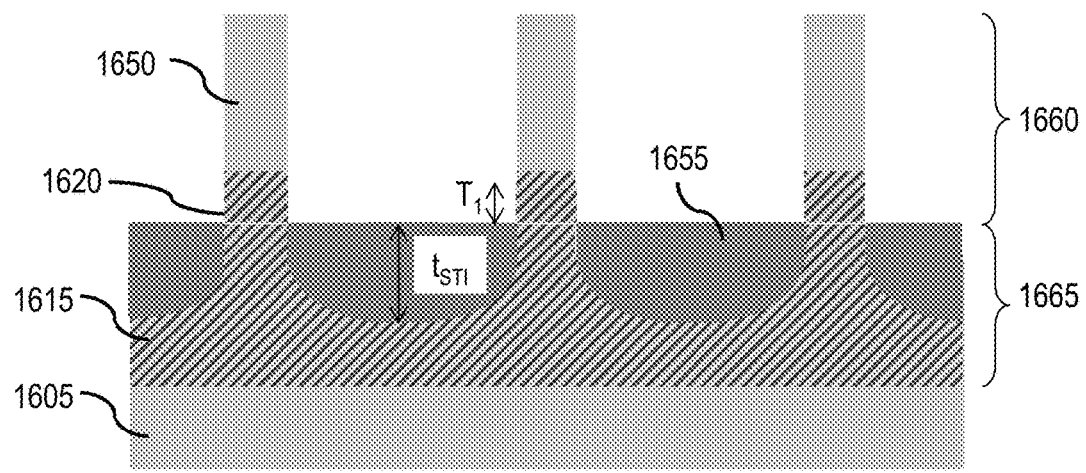
FIGS. 16 and 17 illustrate exemplary operations for manufacturing a semiconductor FET device having a fin structure according to some embodiments of the present disclosure.

For example, in FIG. 16, an isolation insulating layer 1655 has been formed on a surface of a doped layer 1615 of a substrate 1605. In some embodiments, the isolation insulating layer 1655 is formed as part of an STI operation and then etched such that the isolation insulating layer 1655 has an uppermost surface that is substantially equal to a bottommost surface of a doped epitaxial layer 1620. A thickness $t_{STI}$ of the isolation insulating layer 1655 may be in a range of about 20 nm to about 500 nm. In some embodiments, thickness $t_{STI}$ of the isolation insulating layer 1655 is in a range of about 30 nm to about 200 nm. In some embodiments, a thickness $T_1$ of the doped epitaxial layer 1620 is in a range of about 2 nm to about 10 nm.

In some embodiments, to obtain the configuration of FIG. 16, the operations shown in FIGS. 2 through 11 are utilized. In other embodiments, to obtain the configuration of FIG. 16, the operations shown in FIGS. 14 and 15, followed by the operations shown in FIGS. 4 through 11, are utilized. In the etching operation of FIG. 11 or 15, the etching operation is performed on an isolation insulating layer (e.g., 1055 in FIG. 11) such that the resulting isolation insulating layer 1655 has an uppermost surface that is substantially equal to a bottommost surface of a doped epitaxial layer 1620. A thickness $t_{STI}$ of the isolation insulating layer 1655 is in a range of about 100 nm to about 500 nm in some embodiments. A thickness $T_1$ of the doped epitaxial layer 1620 is in a range of about 5 nm to about 30 nm in some embodiments.

A portion of the fin structures 1650 that protrudes from the isolation insulating layer 1655 becomes a channel region 1660 of a Fin FET and a portion of the fin structures 1650 embedded in the isolation insulating layer 1655 becomes a well region 1665 of the Fin FET. The well region 1665 of the Fin FET includes the doped layer 1615 and the doped epitaxial layer 1620.

Figure 17:
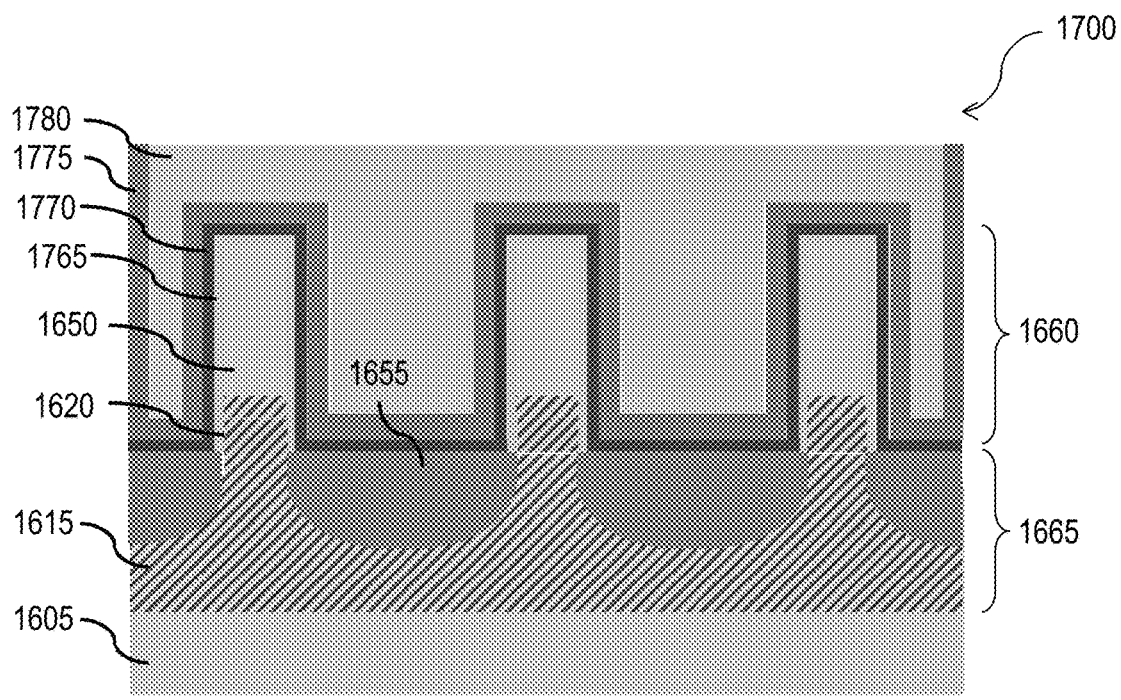

In FIG. 17, a gate structure is formed on the fin structures 1650 and the isolation insulating layer 1655 to form a Fin FET device 1700. The gate structure includes an interfacial layer 1765, a gate dielectric layer 1770, a work function adjustment layer 1775, and a gate electrode 1780, each of which is deposited on the fin structures 1750 and the isolation insulating layer 1655.

Figure 18:
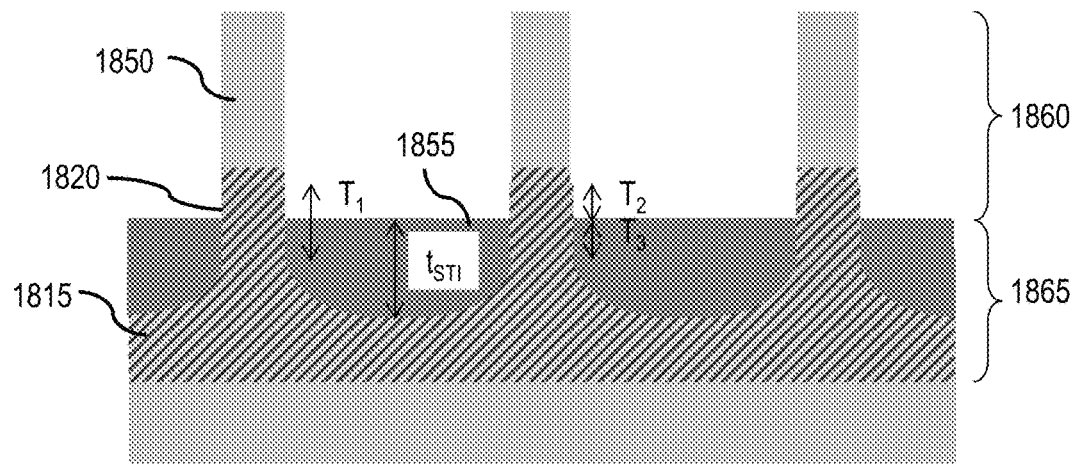
FIGS. 18 and 19 illustrate exemplary operations for manufacturing a semiconductor FET device having a fin structure according to some embodiments of the present disclosure.

In other embodiments, as shown in FIG. 18, an isolation insulating layer (e.g., 1055 in FIG. 10) may be etched such that, for a resulting isolation insulating layer 1855, a portion of a doped epitaxial layer 1820 protrudes from an uppermost surface of the isolation insulating layer 1855 and a portion of the doped epitaxial layer 1820 is embedded in the isolation insulating layer 1855. A thickness $t_{STI}$ of the isolation insulating layer 1855 is in a range of about 30 nm to about 200 nm in some embodiments. A thickness $T_1$ of the doped epitaxial layer 1820 is in a range of about 2 nm to about 10 nm in some embodiments. A thickness $T_2$ of the portion of the doped epitaxial layer 1820 that protrudes from the uppermost surface of the isolation insulating layer 1855 is in a range of about 1 nm to about 3 nm in some embodiments. A thickness $T_3$ of the portion of the doped epitaxial layer 1820 that is embedded in the isolation insulating layer 1855 is in a range of about 1 nm to about 7 nm in some embodiments.

In some embodiments, to obtain the configuration of FIG. 18, the operations shown in FIGS. 2 through 11 are utilized. In other embodiments, to obtain the configuration of FIG.

18, the operations shown in FIGS. 14 and 15, followed by the operations shown in FIGS. 4 through 11, are utilized. In the etching operation of FIG. 11, the etching operation is performed on an isolation insulating layer (e.g., 1055 in FIG. 11) such that a resulting isolation insulating layer 1855 has a portion of a doped epitaxial layer 1820 that protrudes from an uppermost surface of the isolation insulating layer 1855 and a portion of the doped epitaxial layer 1820 that is embedded in the isolation insulating layer 1855.

A portion of the fin structures 1850 that protrudes from the isolation insulating layer 1855 becomes a channel region 1860 of a Fin FET and a portion of the fin structures 1850 embedded in the isolation insulating layer 1855 becomes a well region 1865 of the Fin FET. The well region 1865 of the Fin FET includes a doped layer 1815 and the doped epitaxial layer 1820.

Figure 19:
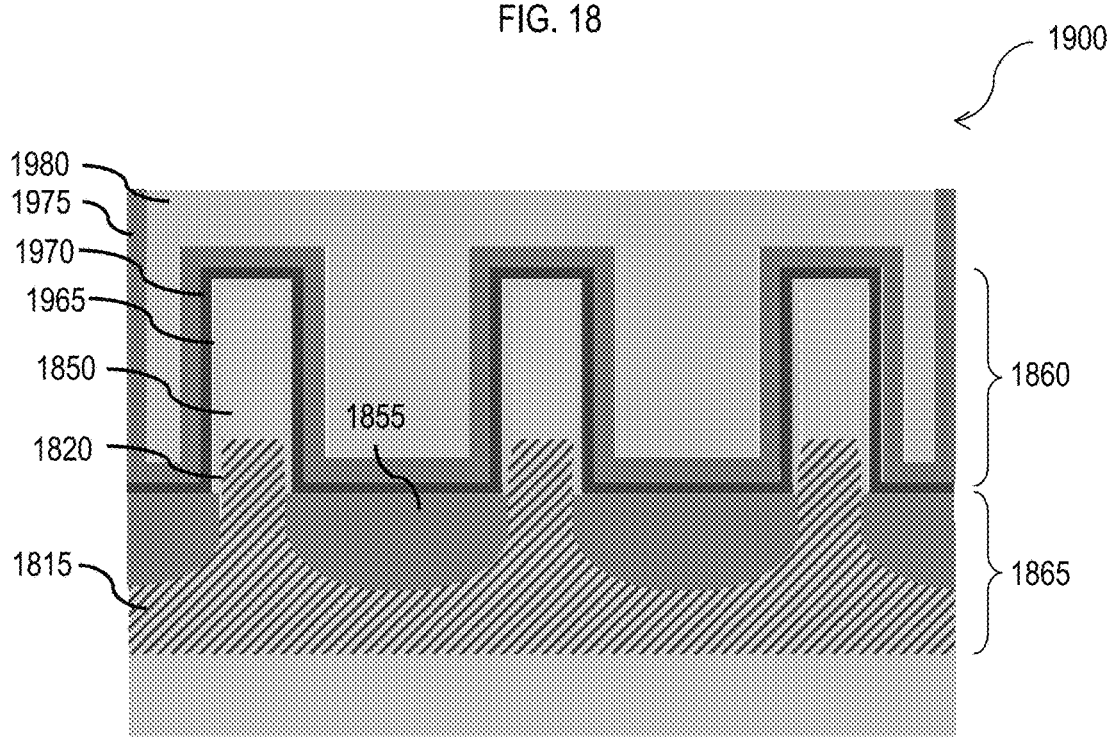

In FIG. 19, a gate structure is formed on the fin structures 1850 and the isolation insulating layer 1855 to form a Fin FET device 1900. The gate structure includes an interfacial layer 1965, a gate dielectric layer 1970, a work function adjustment layer 1975, and a gate electrode 1980, each of which is deposited on the fin structures 1850 and the isolation insulating layer 1955.

FIGS. 20-28 illustrate exemplary sequential operations for manufacturing a semiconductor FET device having a fin structure according to some embodiments of the present disclosure. Not all of the depicted components may be required, however, and one or more implementations may include additional components not shown in the figures. Variations in the arrangement and type of the components may be made without departing from the scope of the claims as set forth herein. Additional components, different components, and/or fewer components may be provided. Further, the order of the operations may be changed.

Figure 20:
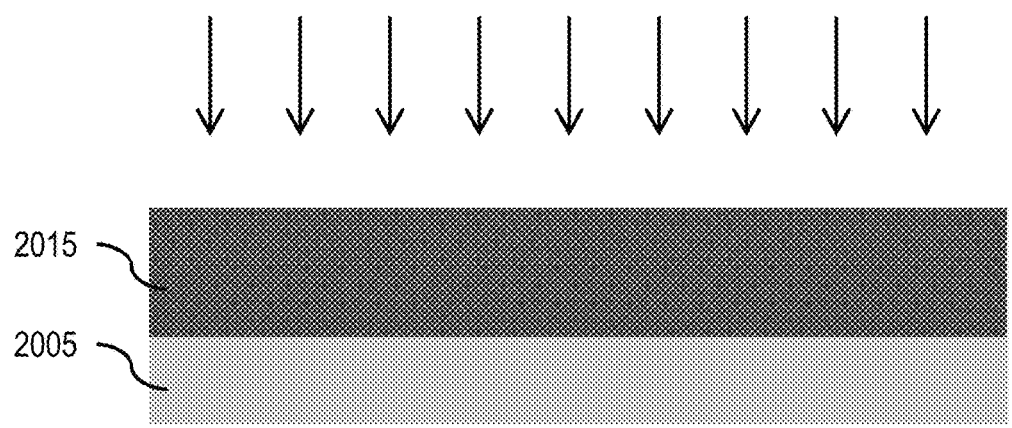
FIGS. 20-28 illustrate exemplary sequential operations for manufacturing a semiconductor FET device having a fin structure according to some embodiments of the present disclosure.

In FIG. 20, a set of dopants is implanted into a substrate 2005 to form a doping layer 2015 in the substrate 2005. Co-implantation dopants are also implanted into the substrate 2005 such that the doped layer 2015 includes the co-implantation dopants. In some embodiments, one or more ion implantation operations are utilized to implant the set of well dopants and co-implantation dopants in the substrate 2005. The set of well dopants may be, for example, boron, boron difluoride ($BF_2$), fluorine, indium, or combination thereof to fabricate a p-well for an n-type Fin FET, and phosphorus, arsenic, fluorine, or combination thereof to fabricate an n-well for a p-type Fin FET. In some embodiments, the co-implantation dopants are, for example, carbon, nitrogen, fluorine, or combinations thereof. In some embodiments, an additional ion implantation operation to implant an APT implant is performed to prevent a punch-through effect. The APT implant is generally utilized for bulk-fin SCE control.

Subsequent to the implantation operation shown in FIG. 20, an annealing operation is performed to activate the dopants in the doped layer 2015. The annealing operation may be performed at a temperature of about 800° C. to about 1200° C. for up to about a minute. In some embodiments, the annealing operation is performed at a temperature of about 600° C. to about 1100° C. for about 0.1 second to about 30 seconds.

The co-implantation dopants may be utilized to inhibit interactions between the well and APT implants with defects (e.g., interstitials/vacancies) in the substrate 2005. For example, excess interstitials in the substrate 2005 may become a source of well implant (e.g., boron for p-well, phosphorus for n-well) transient enhanced diffusion (TED) during an annealing process, since the well implant may diffuse through the defects. The co-implantation dopants may function as interstitial atom getters to reduce the TED.

The co-implantation dopants utilized may depend on the well and/or APT dopant species that are utilized. For example, carbon is generally more effective in suppressing boron APT back-diffusion. Thus, in some embodiments, the co-implantation dopants include carbon when boron is utilized in the APT implant. As another example, nitrogen is generally more effective in suppressing indium APT back-diffusion relative to carbon. Thus, in some embodiments, if indium is used as the APT implant, nitrogen becomes a better candidate for co-implantation than carbon. The co-implantation dopants are generally different from the well and APT implants.

In some embodiments, the co-implantation dopants are implanted at the same time (e.g., during the same doping operation) as the well/APT implantation dopants. In some embodiments, the co-implantation dopants are implanted after the well/APT implantation dopants.

Figure 21:
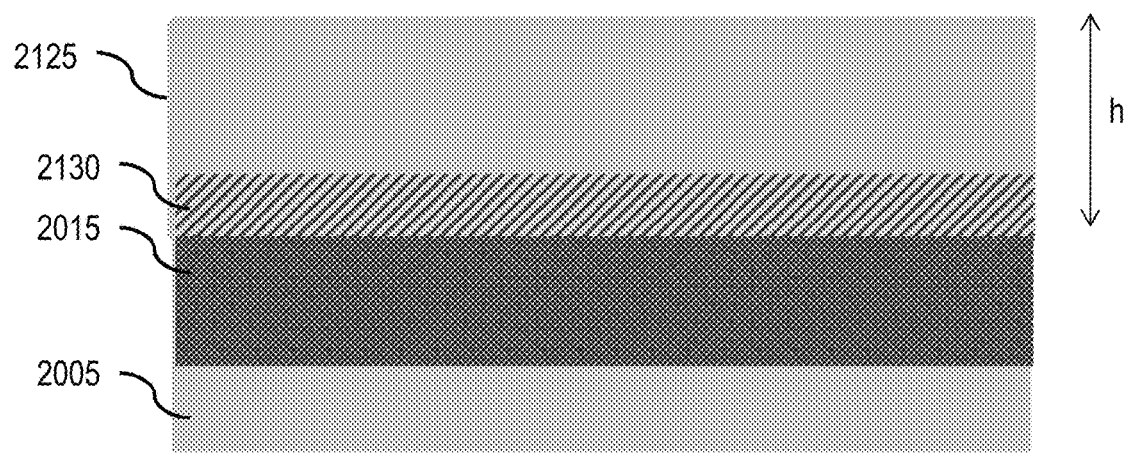

In FIG. 21, an epitaxial layer 2125 is epitaxially grown over a surface of the substrate 2005. The epitaxial layer 2125 may be, for example, silicon. Temperatures associated with the epitaxial growth of the epitaxial layer 2125 may cause the dopants in the doped layer 2015 and to diffuse into the epitaxial layer 2125 to form a doped layer 2130 in the epitaxial layer 2125. The epitaxial layer 2125 is later used to form one or more fin structures. The height h of the epitaxial layer 2125 is in a range of about 100 nm to about 300 nm in some embodiments, and is in a range of about 50 nm to 100 nm in other embodiments.

The co-implantation dopants may be used to facilitate dopant diffusion control. The co-implantation dopants may be utilized as a barrier material that is intermixed with the set of dopants to confine a dopant profile associated with the set of dopants in a well layer 2015 so as to reduce back-diffusion of the dopants from the well layer 2015 to the epitaxial layer 2125. For example, the co-implantation dopants (e.g., C, N, F) may suppress well/APT dopants from diffusing into the epitaxial layer 2125 during an annealing operation. The confinement of the dopant profile facilitates achievement of an abrupt dopant profile between a channel region of a resulting Fin FET device and a well region of the resulting Fin FET device. The co-implantation dopants may allow for better profile abruptness between the channel region and the well region of resulting Fin FET devices by functioning as an interstitial atom getter that retards dopant diffusion. By functioning as an interstitial atom getter, the co-implantation dopants may also reduce channel defect formation during the fin formation operation.

The diffusion may occur during a thermal operation (e.g., annealing operation, epitaxial growth operation), and may cause the dopants to exist in the channel region of the resulting Fin FET devices, which may induce device performance degradation. The reduction in the diffusion may improve short channel control and carrier mobility and may reduce random dopant fluctuation in the resulting Fin FET devices. Furthermore, a reduction of channel defect formation, such as in the epitaxial layer 2125, may allow an improved effective width ($W_{eff}$) and an improved yield.

Figure 22:
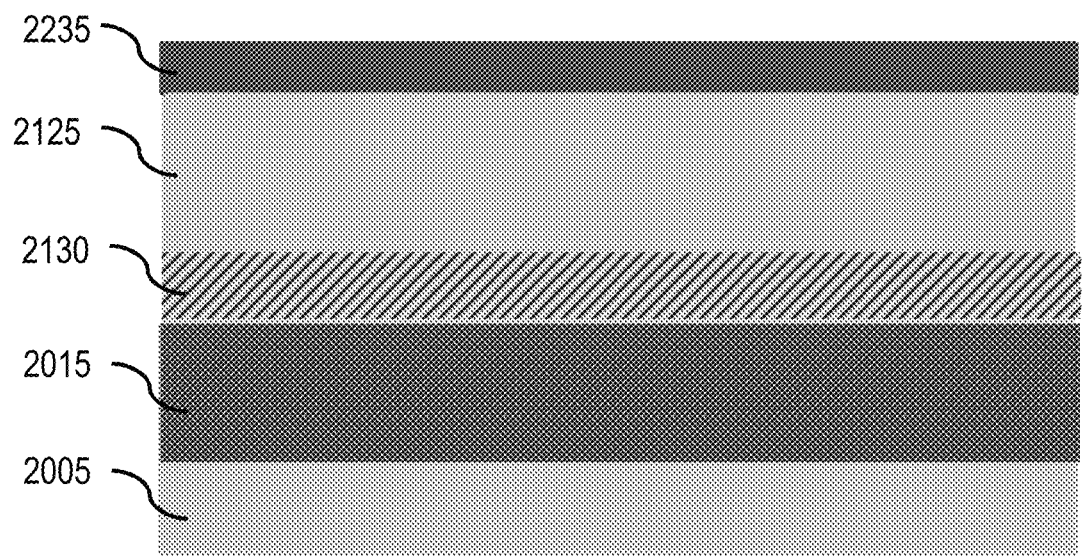
Figure 23:
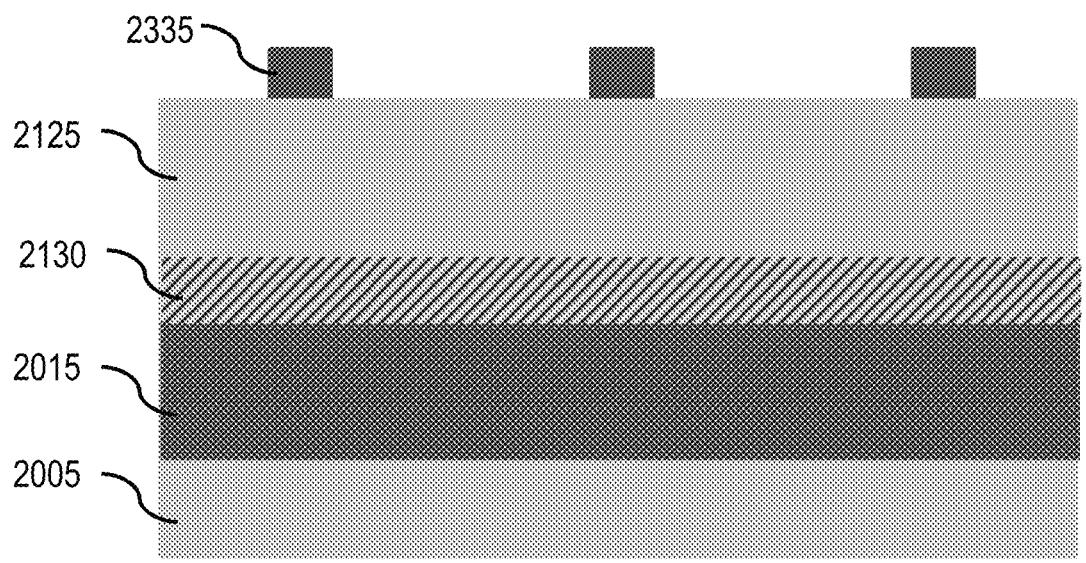
Figure 24:
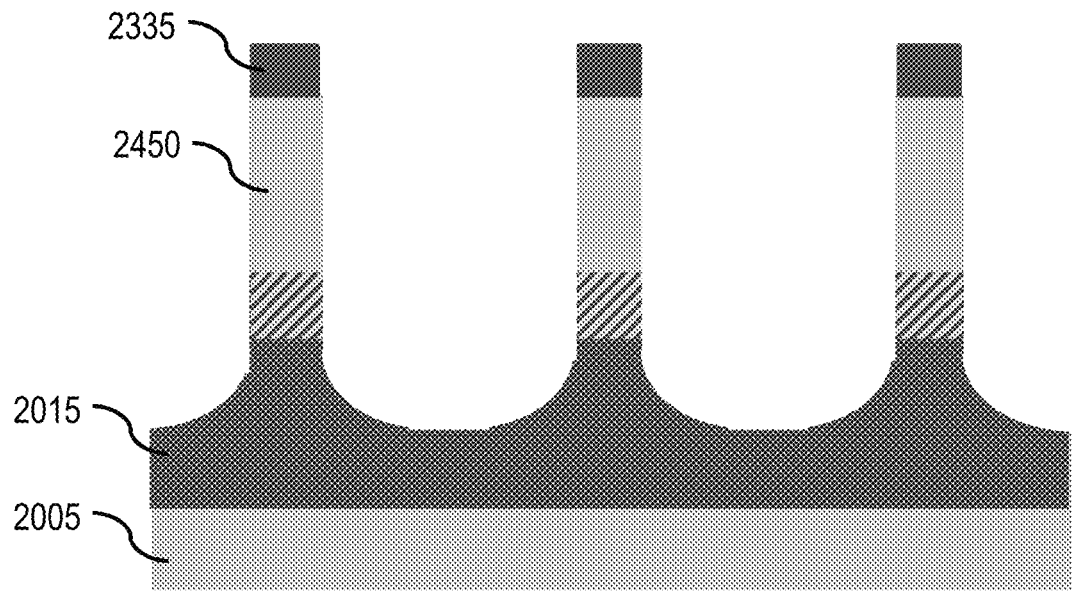

In some embodiments, operations subsequent to the growing operation of the epitaxial layer 2125 follow operations similar to those described previously with reference to FIGS. 7 through 13. In FIG. 22, similar to the operations with respect to FIG. 7, a mask layer 2235 is formed over the epitaxial layer 2125. In FIG. 23, similar to the operations with respect to FIG. 8, the mask layer 2235 is patterned into mask patterns 2335. In FIG. 24, similar to the operations with respect to FIG. 9, by using the mask patterns 2335 as etching masks, fin structures 2450 are formed by etching of the doped layer 2130 of the epitaxial layer 2125, the doped epitaxial layer 2015, and the doped layer 2015 of the substrate 2005.

Figure 25:
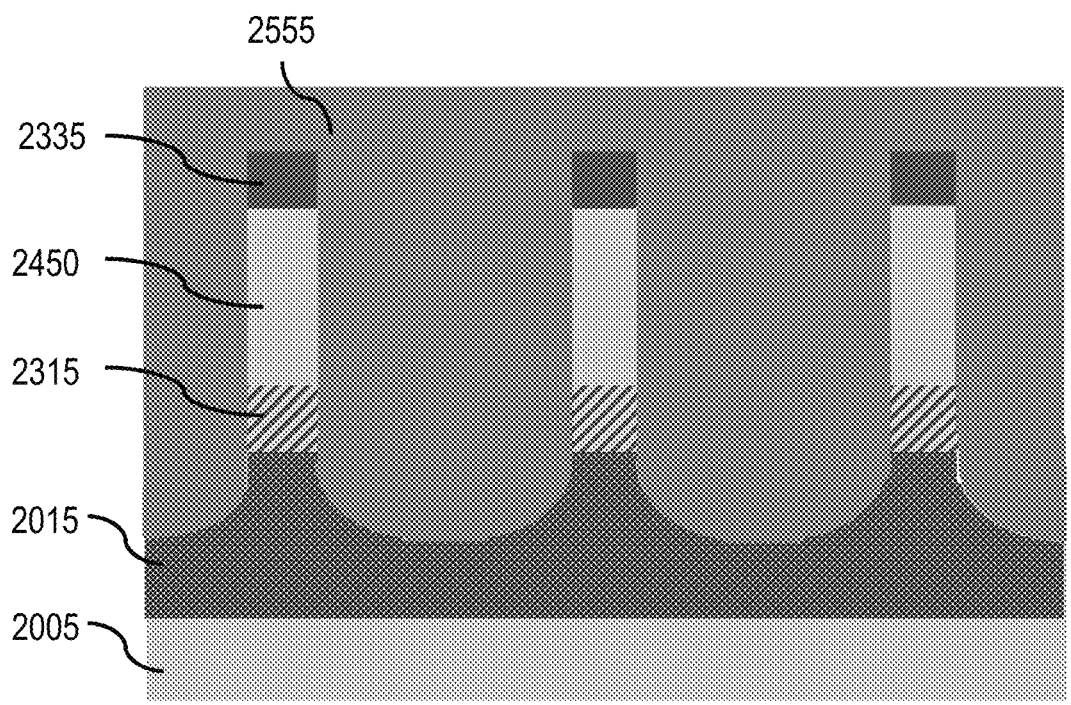
Figure 26:
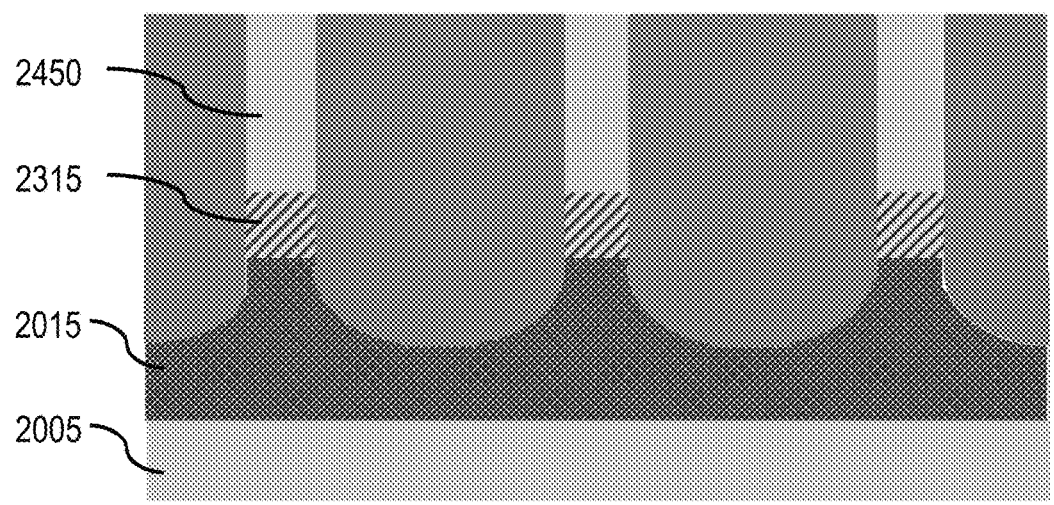
Figure 27:
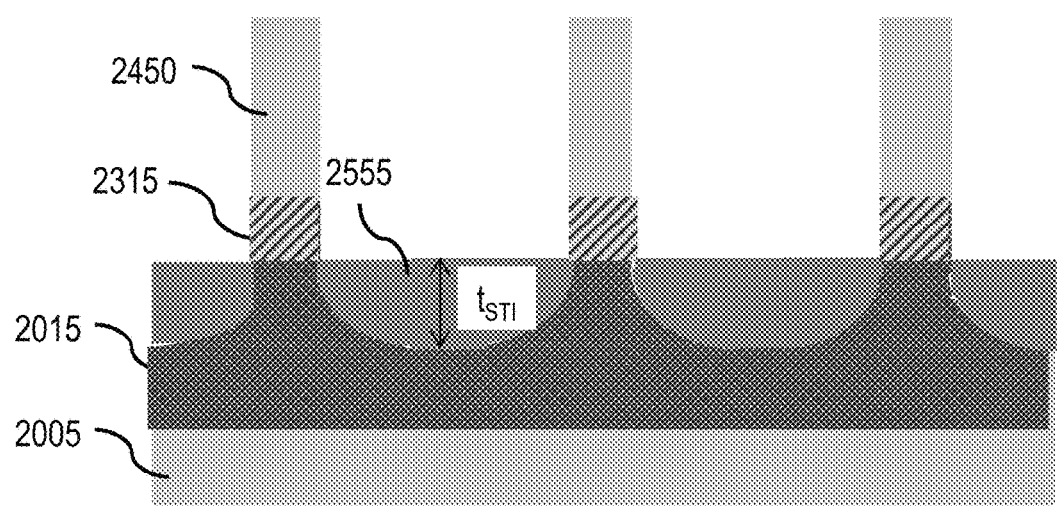
Figure 28:
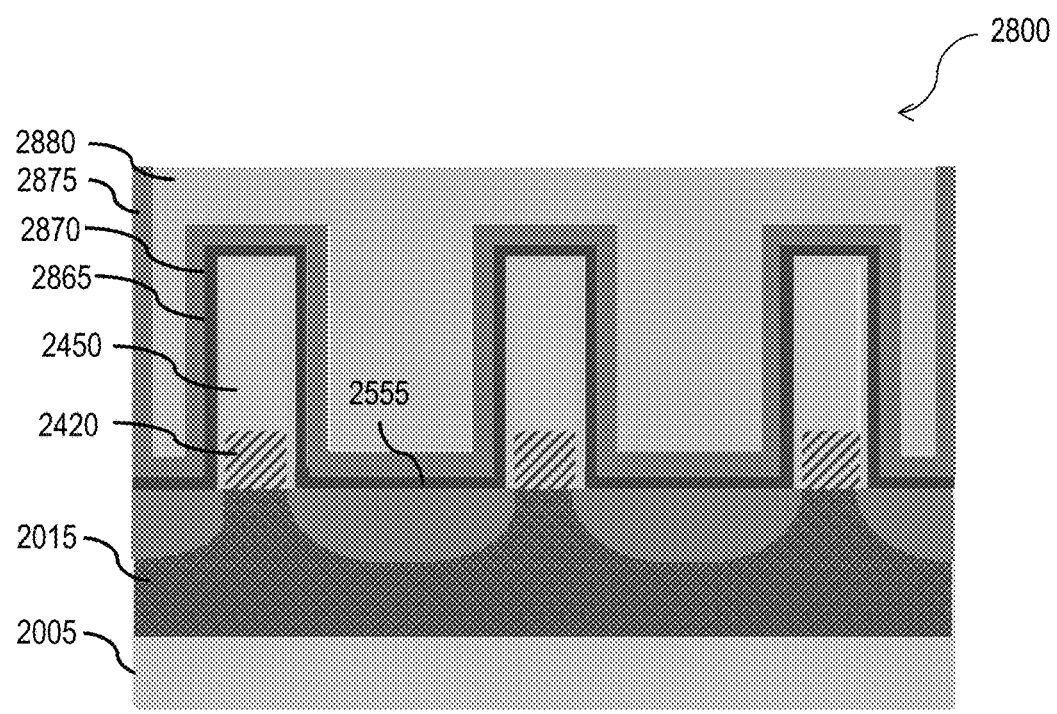

In FIG. 25, similar to the operations with respect to FIG. 10, an isolation insulating layer 2555 is formed on a surface of the doped layer 2015 and around the fin structures 2450 and the mask patterns 2335. In FIG. 26, similar to the operations with respect to FIG. 11, the mask patterns 2335 and a portion of the isolation insulating layer 2555 are removed. In FIG. 27, similar to the operations with respect to FIG. 12, the isolation insulating layer 2555 is etched. In FIG. 28, similar to the operations with respect to FIG. 13, a gate structure is formed on the fin structures 2450 and the isolation insulating layer 2555 to form a Fin FET device 2800. The gate structure includes an interfacial layer 2865, a gate dielectric layer 2870, a work function adjustment layer 2875, and a gate electrode 2880, each of which is deposited on the fin structures 2450 and the isolation insulating layer 2555.

In some embodiments, utilization of a barrier layer (e.g., the epitaxial layer 210 and/or co-implantation dopants) may facilitate dopant diffusion control to allow a junction abruptness improvement of 10 nm of doping profile depth per decade of change in dopant concentration (denoted as 10 nm/dec) than in a case without the barrier layer. Additionally, a 28% dopant reduction in a channel region (e.g., 1260) of a fin structure (e.g., 950) due to diffusion of dopants from a well region (e.g., 1265) of the fin structure may be achieved. Furthermore, the barrier layer may allow a reduction or elimination of doping loss from a fin bottom, such as from diffusion of dopants in the channel region to the well region.

The location of the doped epitaxial layer (e.g., 420 in FIG. 4, 1620 in FIG. 16, 1820 in FIG. 18) relative to the location of the isolation insulating layer (e.g., 1055 in FIG. 12, 1655 in FIG. 16, 1855 in FIG. 18) may affect short channel control and junction abruptness. In some cases, the etching operation may be performed such that the doped epitaxial layer is above an uppermost surface of the isolation insulating layer, which allows improved SCE control for short gate length ($L_g$). In some cases, utilization of the epitaxial layer 1620 in FIG. 16 may have a 4 nm/dec improvement in junction abruptness over utilization of the epitaxial layer 420 in FIG. 4.

The use of a barrier layer, such as an SiC epitaxial layer (e.g., the epitaxial layer 210) or co-implantation, may allow for lower back-diffusion into the channel and improved channel abruptness compared to a baseline case in which no such barrier layer is used. As an example, carbon may be utilized in the barrier layer, such as in the epitaxial layer or in co-implantation. When utilizing an SiC epitaxial layer (e.g., the epitaxial layer 210) as the barrier layer, and the epitaxial layer is grown before an implantation operation (e.g., in FIG. 3), the average channel dopant concentration may be, for example, around half that of the baseline case, fin bottom dopant concentration may be, for example, two-thirds that of the baseline case, and channel abruptness may be, for example, two-thirds that of the baseline case. Similar results arise when utilizing an SiC epitaxial layer (e.g., the epitaxial layer 1510) as the barrier layer, where the epitaxial layer is grown after an implantation operation (e.g., in FIG. 14), as well as when utilizing carbon in co-implantation.

In general, utilizing a barrier layer (e.g., epitaxial layer or co-implantation) allows a lower average channel doping, lower fin bottom dopant concentration, and improved channel abruptness. Aside from Fin FET device characteristics, such as average channel doping, fin bottom dopant concentration, and channel abruptness, factors such as ease and cost of fabrication may need to be taken into consideration when deciding the type of barrier layer, e.g. an epitaxial layer growth operation or a co-implantation operation.

In accordance with one aspect of the present disclosure, a method for manufacturing a semiconductor device includes forming a doped layer in a substrate. A barrier layer that is in contact with the doped layer is formed. A semiconductor layer is formed over the substrate and the barrier layer. A fin structure is formed by patterning the semiconductor layer, the barrier layer, and the doped layer such that the fin structure includes a channel region including the semiconductor layer, and a well region including the doped layer. An isolation insulating layer is formed such that a first portion of the fin structure protrudes from the isolation insulating layer and a second portion of the fin structure is embedded in the isolation insulating layer. A gate structure is formed over the fin structure and the isolation insulating layer.

In accordance with another aspect of the present disclosure, a semiconductor device includes a Fin FET device. The Fin FET device includes a fin structure. The fin structure includes a well layer, a barrier layer in contact with the well layer, and a semiconductor layer. The Fin FET device further includes an isolation insulating layer, where a first portion of the fin structure protrudes from the isolation insulating layer and a second portion of the fin structure is embedded in the isolation insulating layer. The Fin FET device further includes a gate structure covering at least a portion of the fin structure and the isolation insulating layer.

In accordance with yet another aspect of the present disclosure, a method for manufacturing a semiconductor device includes the following steps. A doped layer is formed in a substrate, where the doped layer includes a first set of dopants. A barrier layer that includes a second set of dopants is formed, where at least some of the second set of dopants is interspersed with at least some of the first set of dopants. A semiconductor layer is formed over the substrate. A fin structure is formed by patterning the semiconductor layer, the barrier layer, and the doped layer such that the fin structure includes a channel region including the semiconductor layer, and a well region including the doped layer. An isolation insulating layer is formed such that a first portion of the fin structure protrudes from the isolation insulating layer and a second portion of the fin structure is embedded in the isolation insulating layer. A gate structure is formed over the fin structure and the isolation insulating layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising: implanting a first dopant to form a doped layer in a substrate;
   implanting a second dopant in the substrate;
   forming a semiconductor layer over the substrate;

forming a barrier layer in the semiconductor layer by diffusing first and second dopants from the substrate into the semiconductor layer;

forming a fin structure by patterning the semiconductor layer, the barrier layer, and the doped layer;

forming an isolation insulating layer such that a first portion of the fin structure protrudes from the isolation insulating layer and a second portion of the fin structure is embedded in the isolation insulating layer; and forming a gate structure over the fin structure and the isolation insulating layer, wherein at least a portion of the barrier layer protrudes from the isolation insulating layer along a direction toward the gate structure.

2. The method of claim 1, further comprising annealing to activate the dopants.

3. The method of claim 1, wherein forming the semiconductor layer comprises growing an epitaxial layer on the substrate.

4. The method of claim 1, wherein the barrier layer comprises silicon carbide or a silicon compound including carbon.

5. The method of claim 3, wherein at least a portion of the epitaxial layer is embedded in the isolation insulating layer.

6. The method of claim 1, wherein the semiconductor layer comprises silicon and is epitaxially formed over the substrate.

7. The method of claim 1, further comprising forming at least one additional fin structure, wherein a first portion of the at least one additional fin structure protrudes from the isolation insulating layer and a second portion of the at least one additional fin structure is embedded in the isolation insulating layer.

8. A semiconductor device, comprising:
a Fin FET device comprising:
a fin structure, wherein the fin structure comprises a well layer, a barrier layer in contact with the well layer, and a semiconductor layer;
an isolation insulating layer, wherein a first portion of the fin structure protrudes from the isolation insulating layer and a second portion of the fin structure is embedded in the isolation insulating layer; and
a gate structure covering at least a portion of the fin structure and the isolation insulating layer,
wherein the barrier layer comprises a first set of dopants and a second set of dopants and an epitaxial layer, the epitaxial layer comprising a silicon carbon.

9. The semiconductor device of claim 8, wherein at least a portion of the epitaxial layer protrudes from the isolation insulating layer and at least a portion of the epitaxial layer is embedded in the isolation insulating layer.

10. The semiconductor device of claim 8, wherein:
the Fin FET device is an n-type Fin FET device, and
the barrier layer comprises two or more dopants comprising boron, indium, fluorine, carbon, or nitrogen.

11. The semiconductor device of claim 8, wherein:
the Fin FET device is a p-type Fin FET device, and
the barrier layer comprises two or more dopants selected from the group consisting of phosphorus, arsenic, fluorine, carbon, and nitrogen.

12. A method for manufacturing a semiconductor device, comprising:
forming a doped layer in a substrate, wherein the doped layer comprises a first set of dopants;
forming a barrier layer that comprises a second set of dopants, wherein at least some of the second set of dopants is interspersed with at least some of the first set of dopants;
forming a semiconductor layer over the substrate;
forming a fin structure by patterning the semiconductor layer, the barrier layer, and the doped layer such that the fin structure comprises a channel region including the semiconductor layer, and a well region including the doped layer;
forming an isolation insulating layer such that a first portion of the fin structure protrudes from the isolation insulating layer and a second portion of the fin structure is embedded in the isolation insulating layer; and
forming a gate structure over the fin structure and the isolation insulating layer.

13. The method of claim 12, further comprising annealing to activate the first set of dopants and the second set of dopants.

14. The method of claim 12, wherein the barrier layer is formed prior to the doped layer.

15. The method of claim 12, wherein forming the barrier layer comprises growing an epitaxial layer on the substrate.

16. The method of claim 12, wherein forming the barrier layer comprises implanting the second set of dopants in the substrate.

* * * * *